(12) United States Patent
Lee et al.

(10) Patent No.: US 11,765,820 B2
(45) Date of Patent: Sep. 19, 2023

(54) PRINTED CIRCUIT BOARD

(71) Applicant: SAMSUNG ELECTRO-MECHANICS CO., LTD., Suwon-si (KR)

(72) Inventors: Jae Heun Lee, Suwon-si (KR); Yong Soon Jang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/144,371

(22) Filed: Jan. 8, 2021

(65) Prior Publication Data
US 2022/0124906 A1 Apr. 21, 2022

(30) Foreign Application Priority Data

Oct. 15, 2020 (KR) .................. 10-2020-0133219

(51) Int. Cl.
*H05K 1/02* (2006.01)
*H05K 1/11* (2006.01)
*H05K 1/18* (2006.01)
*H05K 1/09* (2006.01)

(52) U.S. Cl.
CPC ........... *H05K 1/0296* (2013.01); *H05K 1/115* (2013.01); *H05K 1/09* (2013.01); *H05K 1/11* (2013.01); *H05K 1/116* (2013.01); *H05K 1/181* (2013.01)

(58) Field of Classification Search
CPC ............................ H05K 1/0296; H05K 1/115
See application file for complete search history.

(56) References Cited

U.S. PATENT DOCUMENTS

| 6,756,619 | B2 * | 6/2004 | Tran .................... H01L 29/4916 257/294 |
| 7,834,277 | B2 * | 11/2010 | Ohsumi ................. H05K 3/427 174/266 |
| 8,039,399 | B2 * | 10/2011 | Niroomand ......... H01L 21/0337 438/694 |
| 8,741,735 | B1 * | 6/2014 | Hwang ............... H01L 21/7682 438/411 |

(Continued)

FOREIGN PATENT DOCUMENTS

| JP | H0870104 A | * | 3/1996 |
| KR | 10-2008-0006807 A | | 1/2008 |

(Continued)

*Primary Examiner* — Ishwarbhai B Patel
(74) *Attorney, Agent, or Firm* — Morgan, Lewis & Bockius LLP

(57) ABSTRACT

A printed circuit board includes an insulating layer and a circuit layer disposed on the insulating layer. The circuit layer includes a first circuit pattern and a second circuit pattern. Each of the first and second circuit patterns has a first side surface, a second side surface opposing the first side surface, and a top surface connected to ends of the first and second side surfaces, when viewed in a cross section direction. The first side surface of the first circuit pattern and the first side surface of the second circuit pattern face each other. A height of the first side surface of the first circuit pattern is greater than a height of the second side surface of the first circuit pattern, and a height of the first side surface of the second circuit pattern is greater than a height of the second side surface of the second circuit pattern.

21 Claims, 18 Drawing Sheets

(56) References Cited

U.S. PATENT DOCUMENTS

| | | | |
|---|---|---|---|
| 8,741,781 B2 * | 6/2014 | Dorhout | H01L 21/0337 |
| | | | 438/736 |
| 9,497,864 B2 * | 11/2016 | Kung | H01L 24/16 |
| 2007/0029616 A1 * | 2/2007 | Choi | H01L 21/823412 |
| | | | 257/E21.624 |
| 2010/0144150 A1 * | 6/2010 | Sills | H01L 21/31138 |
| | | | 438/694 |
| 2012/0139086 A1 | 6/2012 | Kim et al. | |
| 2013/0153266 A1 * | 6/2013 | Hyun | H05K 1/0216 |
| | | | 174/250 |
| 2015/0357276 A1 * | 12/2015 | Shimizu | H01L 23/49827 |
| | | | 361/783 |
| 2016/0113114 A1 * | 4/2016 | Chan | H05K 3/0097 |
| | | | 174/251 |
| 2019/0051592 A1 * | 2/2019 | Kim | H01L 23/15 |

FOREIGN PATENT DOCUMENTS

| | | | |
|---|---|---|---|
| KR | 20110087976 A | * | 8/2011 |
| KR | 10-1834253 B1 | | 3/2018 |

* cited by examiner

PRINTED CIRCUIT BOARD

CROSS-REFERENCE TO RELATED APPLICATION(S)

The present application claims the benefit of priority to Korean Patent Application No. 10-2020-0133219, filed on Oct. 15, 2020 in the Korean Intellectual Property Office, the entire disclosure of which is incorporated herein by reference.

TECHNICAL FIELD

The present disclosure relates to a printed circuit board.

BACKGROUND

Recently, high-density printed circuit boards (PCBs) are required in the electronic component industry to support 5G high-speed communications and artificial intelligence (AI). Microcircuit technologies are important for high-density PCBs, and research and development are currently underway to reduce lines and spaces of circuit patterns.

Common circuit formation methods, implemented in the field of PCB design, are a semi-additive process (SAP), a modified SAP (MSAP), tenting (TT), and the like. However, such a plating process is limited in reducing lines and spaces of circuit patterns as desired, due to process margins of an exposure process and an isotropic etching process (a wet etching process).

SUMMARY

An aspect of the present disclosure is to provide a printed circuit board, capable of securing a margin in an exposure process.

Another aspect of the present disclosure is to provide a printed circuit board, capable of improving circuit integration density.

One of several solutions suggested through the present disclosure is to secure a pair of fine circuit patterns disposed adjacent to each other, such that one side surface of one fine circuit pattern and one side surface of the other fine circuit pattern face each other, using a spacer formation method and an anisotropic etching process.

According to an aspect of the present disclosure, a printed circuit board includes a first insulating layer and a first circuit layer disposed on the first insulating layer. The first circuit layer includes a first circuit pattern and a second circuit pattern. Each of the first and second circuit patterns has a first side surface, a second side surface opposing the first side surface, and a top surface connected to ends of the first and second side surfaces, when viewed in a cross section direction. The first side surface of the first circuit pattern and the first side surface of the second circuit pattern are disposed to face each other. A height of the first side surface of the first circuit pattern is greater than a height of the second side surface of the first circuit pattern, and a height of the first side surface of the second circuit pattern is greater than a height of the second side surface of the second circuit pattern.

According to an aspect of the present disclosure, a printed circuit board includes a first insulating layer and a first circuit layer disposed on the first insulating layer. The first circuit layer includes a first circuit pattern and a second pattern, disposed as a pair of circuit patterns, such that side surfaces of the first and second circuit patterns face each other, and a third circuit pattern disposed outside of the first and second circuit patterns. The third circuit pattern has a greater line width than each of the first and second circuit patterns.

According to an aspect of the present disclosure, a printed circuit board includes an insulating layer and a circuit layer including first to fourth circuit patterns sequentially disposed on the insulating layer. The insulating layer includes a first portion between the first and second circuit patterns, a second portion between the second and third circuit patterns, and a third portion between the third and fourth circuit patterns. Either of both of the first portion and the third portion or the second portion includes a groove portion.

According to an aspect of the present disclosure, a printed circuit board includes a first insulating layer, a first circuit layer disposed on the first insulating and comprising a first circuit pattern and a first pad pattern, a second insulating layer disposed on the first insulating layer and covering the first circuit layer, a second circuit layer disposed on the second insulating layer and comprising a second circuit pattern and a second pad pattern, and a via disposed in the second insulating layer and connecting the first pad pattern and the second pad pattern to each other. A thickness of the first circuit pattern is different from a thickness of the first pad pattern.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, embodiments of the present disclosure will be described as follows with reference to the attached drawings.

Figure 1:
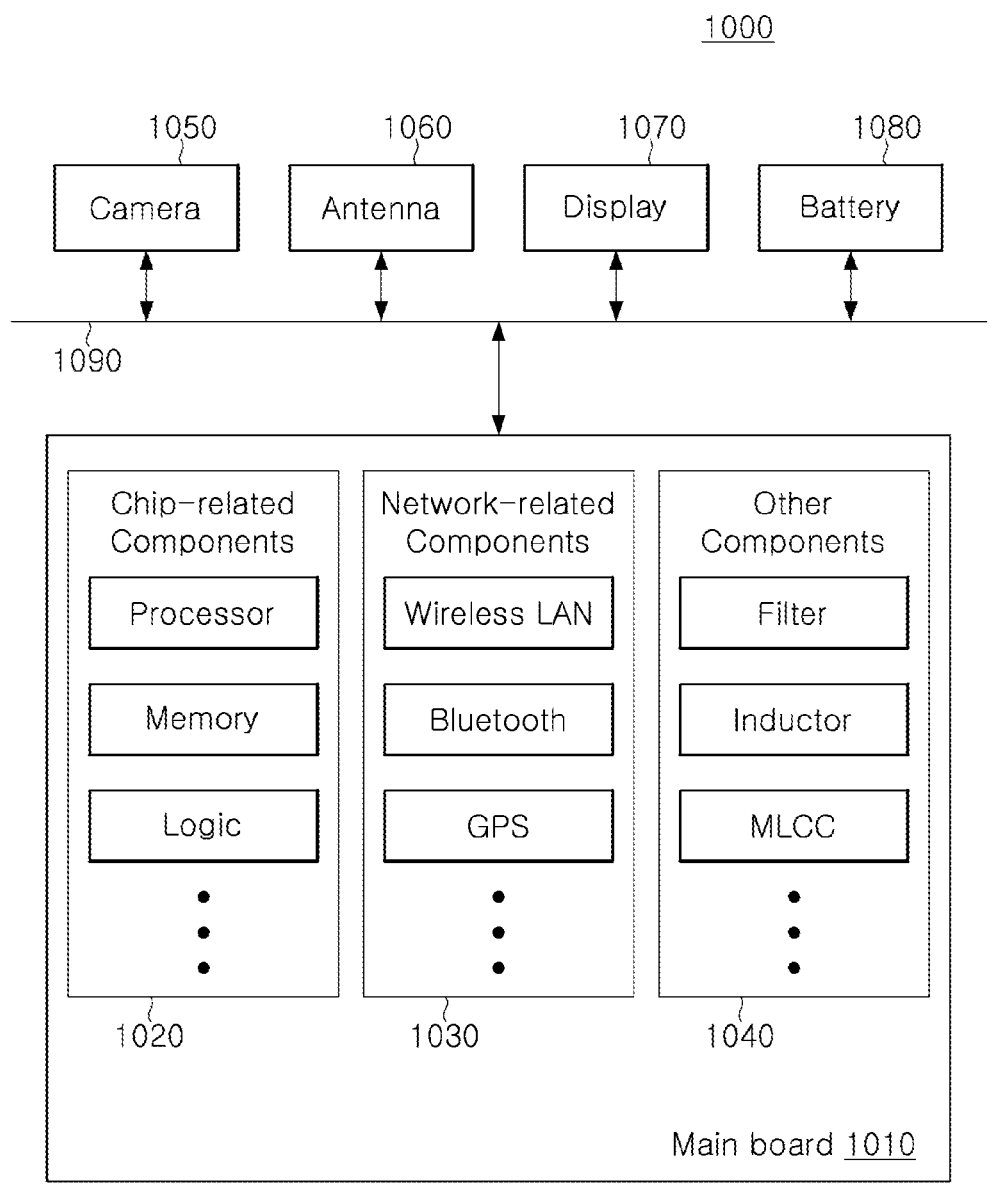
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 maybe combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
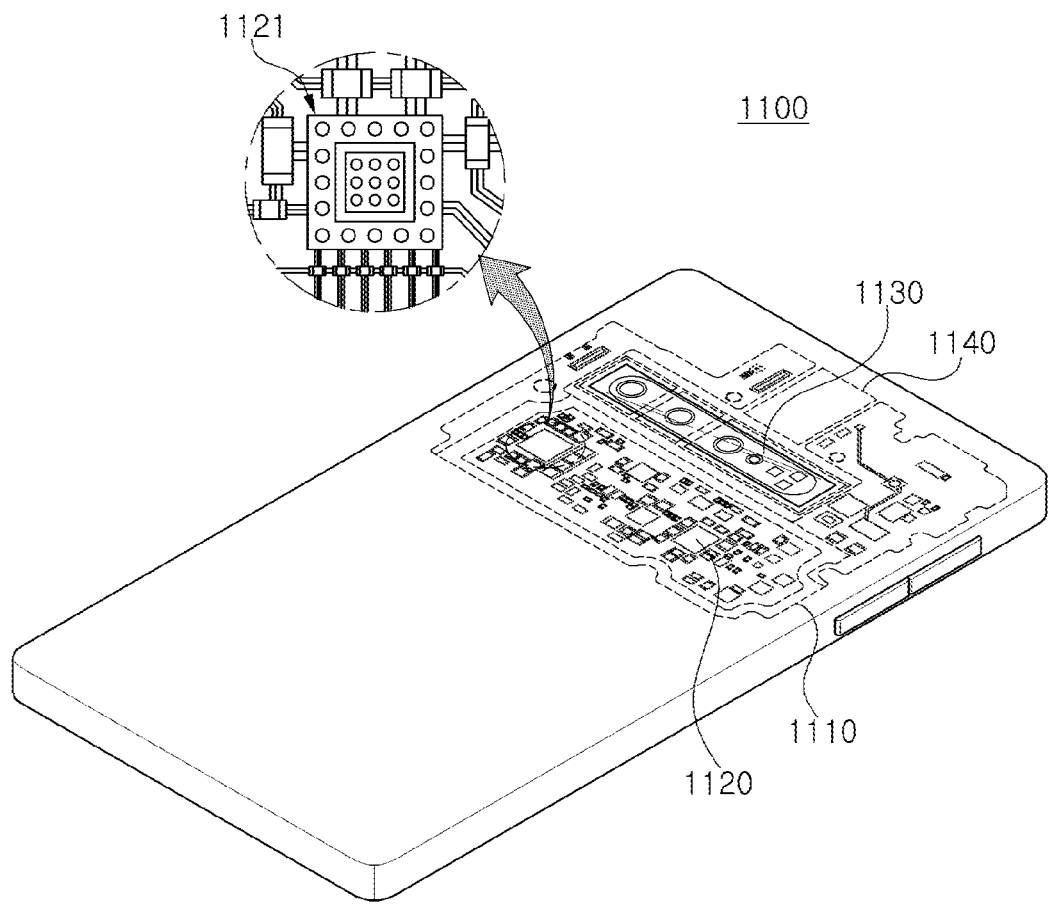
FIG. 2 is perspective view illustrating an example of an electronic device.

FIG. 2 is perspective view illustrating an example of an electronic device.

Referring to FIG. 2 an electronic device may be, for example, a smartphone 1100. A mainboard 1110 may be accommodated in the smartphone 1100, and various electronic components 1120 maybe physically and/or electrically connected to the mainboard 1110. In addition, a camera module 1130 and/or a speaker 1140 maybe accommodated in the smartphone 1100. Some of the electronic components 1120 may be the above-described chip related components, for example, an electronic component package 1121 in which a plurality of electronic components are mounted on a package substrate, but is not limited thereto. The electronic device is not necessarily limited to the smartphone 1100 and may be another electronic device, as described above.

Figure 3:
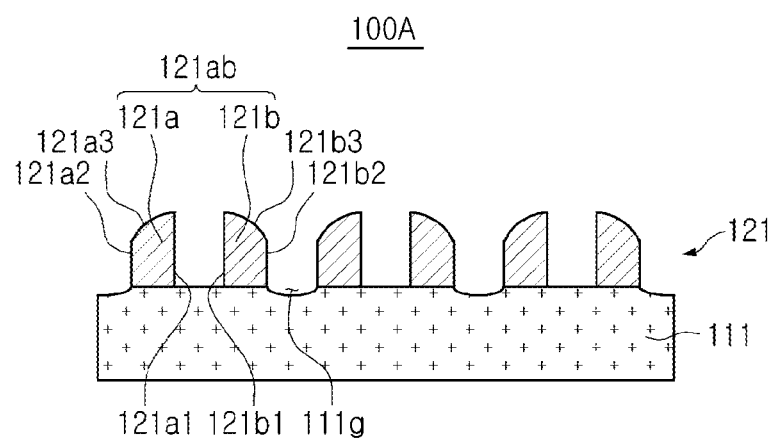
FIG. 3 is a schematic cross-sectional view illustrating an example of a printed circuit board.

FIG. 3 is a schematic cross-sectional view illustrating an example of a printed circuit board.

Referring to FIG. 3, a printed circuit board 100A according to an exemplary embodiment may include an insulating layer 111 and a circuit layer 121 disposed on the insulating layer 111. The circuit layer 121 may include a first circuit pattern 121a and a second circuit pattern 121b. The first circuit pattern 121a may have a first side surface 121a1, a second side surface 121a2 opposing the first side surface 121a1, and a top surface 121a3 connected to ends of the first and second side surfaces 121a1 and 121a2, when viewed from the cross section. For example, the cross section may refer to a cross section perpendicular or substantially perpendicular to a main surface of the printed circuit board 100A or a main surface of the insulating layer 111 on which the circuit layer 121 is disposed. Similarly, the second circuit pattern 121b may have a first side surface 121b1, a second side surface 121b2 opposing the first side surface 121b1, and a top surface 121b3 connected to ends of the first and second side surfaces 121b1 and 121b2, when viewed from the cross section. The first circuit pattern 121a and the second circuit pattern 121b, as a pair, may constitute a microcircuit portion 121ab having a substantially symmetrical shape, and the circuit layer 121 may include a plurality of such microcircuit portions 121ab.

In the microcircuit portion 121ab, the first circuit pattern 121a and the second circuit pattern 121b may be disposed such that the first side surfaces 121a1 and 121b face each other. In the first circuit pattern 121a, the first surface 121a1 may have a greater height than the second side surface 121a2, and the top surface 121a3 may have a rounded shape of which a height is gradually decreased from the end of the first side surface 121a1 to the end of the second side surface 121a2. Similarly, in the second circuit pattern 121b, the first side surface 121b1 may have a greater height than the second side surface 121b2, and the top surface 121b3 may have a rounded shape of which a height is gradually decreased from the end of the first side surface 121b1 to the end of the second side surface 121b2.

The insulating layer 111 may have a groove portion 111g between the microcircuit portions 121ab. Such a groove portion 111g may not be formed between the first circuit pattern 121a and the second circuit pattern 121b of the microcircuit portion 121ab. Accordingly, the groove portion 111g may be recessed toward a lower surface of the insulating layer 111, based on an upper surface of the insulating layer 111 between the first circuit pattern 121a and the second circuit pattern 121b.

As can be seen from a process to be described later, the microcircuit portion 121ab including the first circuit pattern 121a and the second circuit pattern 121b having such a structure may be formed using a spacer formation method and an anisotropic etching process. In this case, as will be described later, even when a photosensitive material is exposed at a line-to-space ratio of one-to-many, a microcircuit pattern having a line-to-space ratio of approximately one-to-one may be implemented to secure a margin of the exposure process. Thus, circuit integration density may be improved.

Hereinafter, components of the printed circuit board 100A according to an exemplary embodiment will be additionally described with reference to accompanying drawings.

A material of the insulating layer 111 may be an insulating material. The insulating material may be a thermosetting resin such as an epoxy resin, a thermoplastic resin such as polyimide, or an insulating material in which an inorganic filler such as silica and/or a reinforcing material such as a glass fiber is included in the resins, for example, copper clad laminate (CCL), prepreg (PPG), Ajinomoto Build-up Film (ABF), or the like. However, the insulating material is not limited thereto, and may be a photosensitive insulating material such as a photoimageable dielectric (PID), other than such non-photosensitive insulating materials. As necessary, an inorganic material such as ceramic maybe used as the material of the insulating layer 111.

A material of the circuit layer 121 may be a metal material. The metal material maybe copper (Cu), aluminum (Al), silver (Ag), tin (Sn), gold (Au), nickel (Ni), lead (Pb), titanium (Ti), or alloys thereof. For example, the first and second circuit patterns 121a and 121b may include copper (Cu). The microcircuit portion 121ab of the circuit layer 121, for example, the first and second circuit patterns 121a and 121b may each perform various functions depending on designs thereof. The first and second circuit patterns 121a and 121b may include, for example, a ground pattern, a power pattern, a signal pattern, or the like. Each of the patterns may have a linear shape. For example, each of the first and second circuit patterns 121a and 121b may have a linear shape. In the drawings, one cross section may be illustrated to show line widths of the first and second circuit patterns 121a and 121b having such a linear shape and intervals between lines, for example, lines and spaces.

Figure 4:
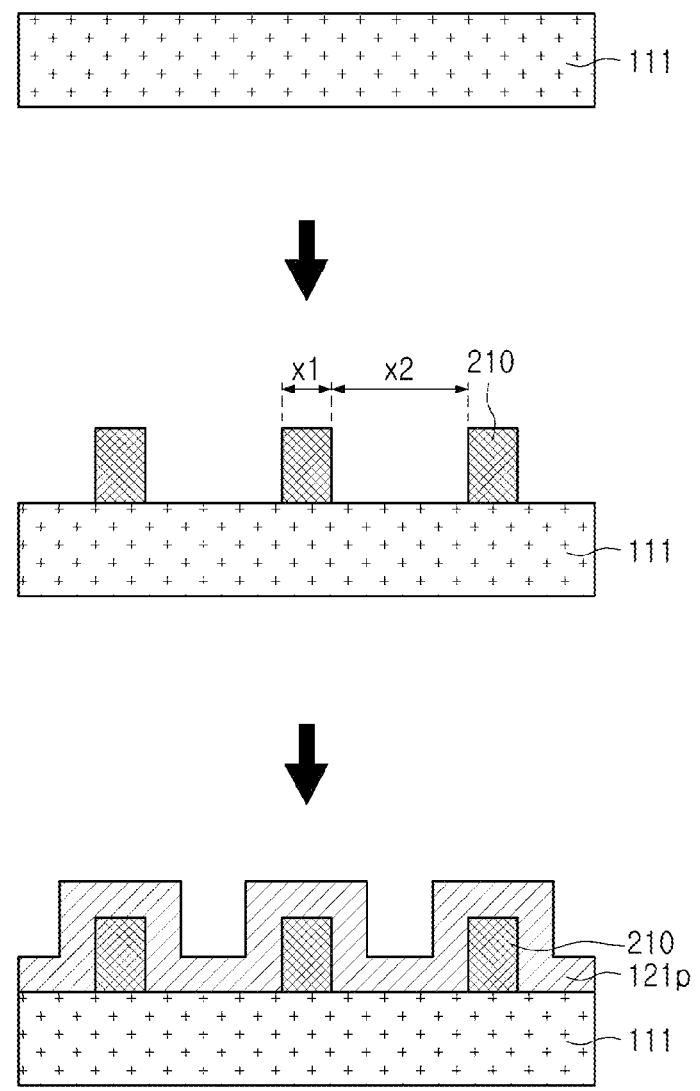
FIGS. 4 and 5 are schematic process views illustrating an example of a method of manufacturing the printed circuit board of FIG. 3.
Figure 5:
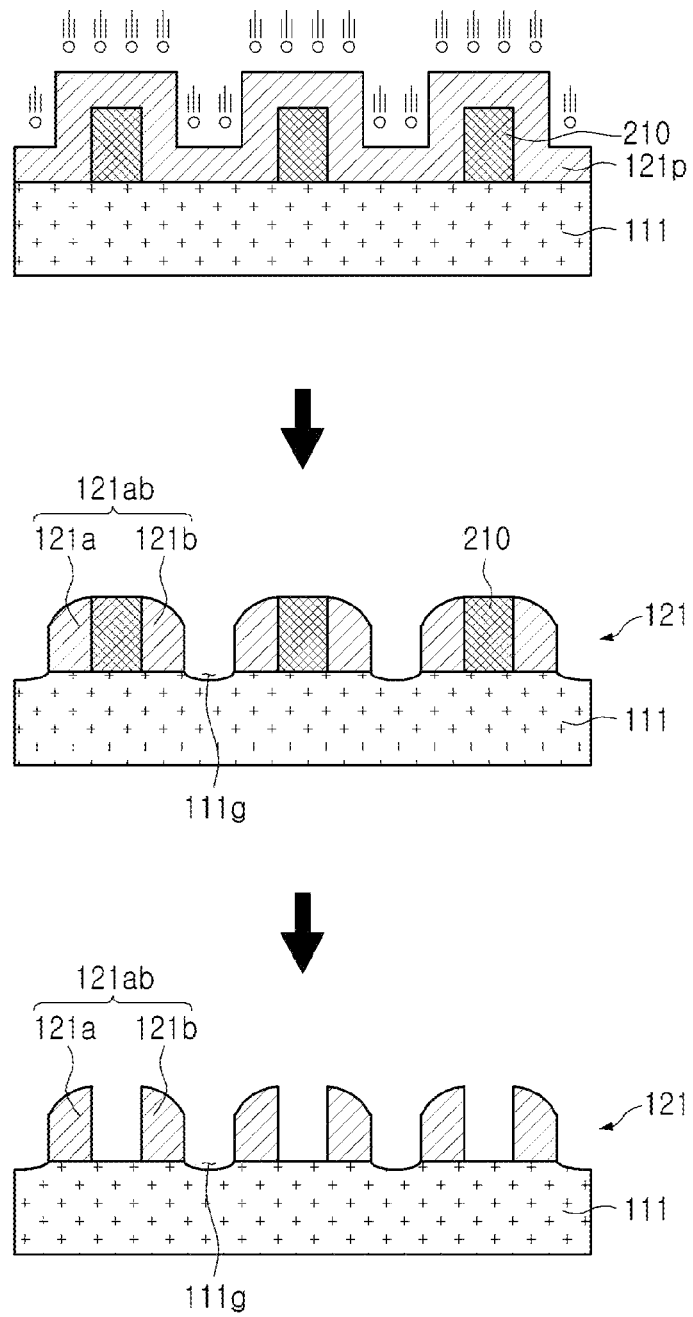

FIGS. 4 and 5 are schematic process views illustrating an example of a method of manufacturing the printed circuit board of FIG. 3.

Referring to FIG. 4, an insulating layer 11 may be prepared. Patterned dry films 210 may be provided on the insulating layer 111. The dry film 210 may include a photosensitive material. The dry film 210 may be patterned such that a ratio of a line width x1 to a space width x2 has approximately a one-to-many relationship, for example, one to three (1:3). A pattern plating layer 121p may be formed on the insulating layer 111 to cover the patterned dry films 210. The pattern plating layer 121p may be formed using an isotropic plating process such as an electroless plating process, or the like.

Referring to FIG. 5, an anisotropic etching process may be performed. The anisotropic etching process may be performed using a dry etching process. When the anisotropic etching process is performed, a plurality of microcircuit portions 121ab, each including a pair of first and second circuit patterns 121a and 121b, may be formed. In this case, a groove portion 111g may be formed in a region, in which the dry film 210 is not present, of the insulating layer 111 between the microcircuit portions 121ab. When the dry film 210 is peeled off, a first circuit pattern 121a and a second circuit pattern 121b, having a line-to-space ratio of approximately one to one (1:1), and a microcircuit portion 121ab including the first and second circuit patterns 121a and 121b may be obtained. The above-described printed circuit board 100A may be manufactured through a series of processes.

Figure 6:
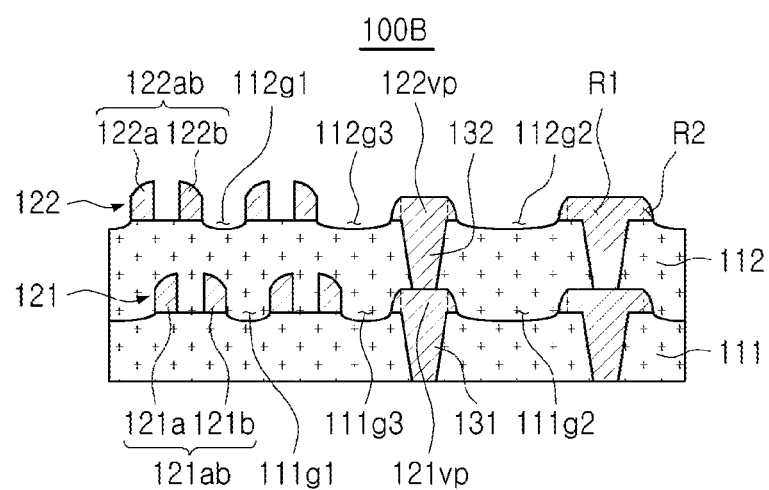
FIG. 6 is a schematic cross-sectional view illustrating another example of a printed circuit board.

FIG. 6 is a schematic cross-sectional view illustrating another example of a printed circuit board.

Referring to FIG. 6, as compared with above-described printed circuit board 100A, a printed circuit board 100B according to another exemplary embodiment may include circuit layers 121 and 122 having a multilayer structure. The circuit layers 121 and 122 may respectively include pad patterns 121vp and 122vp to achieve electrical connection between the circuit layers 121 and 122. Via patterns 131 and 132 may be formed on the insulating layers 111 and 112 to be connected to the pad patterns 121vp and 122vp, respectively. For example, the printed circuit board 100B may include a first insulating layer 111, a first circuit layer 121 disposed on the first insulating layer 111, a first via pattern 131 penetrating through the first insulating layer 111, a second insulating layer 112 disposed on the first insulating layer 111 and covering the first circuit layer 121, and a second via pattern 132 penetrating through the second insulating layer 112. In this case, the first circuit layer 121 may include first and second circuit patterns 121a and 121b and the first pad pattern 121vp, and the second circuit layer 122 may include third and fourth circuit patterns 122a and 122b and the second pad pattern 122vp. The first via pattern 131 may be connected to the first pad pattern 121vp, and the second via pattern 132 may be connected to the first and second pad patterns 121vp and 122vp.

As a feature of the process to be described later, the second pad pattern 122vp may include a first region R1, integrated with the second via pattern 132 without a boundary between the first region R1 and the second via pattern 132, and a second region R2 surrounding the first region R2 and having a boundary with the first region R1. Similarly, the first pad pattern 121vp may include such first and second regions in relation to the first via pattern 131. The first and second circuit patterns 121a and 121b, as a pair of circuit patterns having a substantially symmetrical shape, may constitute a first microcircuit portion 121ab. A first groove portion 111g1 may be formed on the first insulating layer 111 between the first microcircuit portions 121ab. In addition, a second groove portion 111g2 may be formed on the first insulating layer 111 between the first pad patterns 121vp, and a third groove portion 111g3 may be formed on the first insulating layer 111 between the first microcircuit portion 121ab and the first pad pattern 121vp. Similarly, the third and fourth circuit patterns 122a and 122b, as a pair of circuit patterns having a substantially symmetric shape, may constitute a second microcircuit portion 122ab. A fourth groove portion 112g1 maybe formed on the second insulating layer 112 between the second microcircuit portions 122ab. In addition, a fifth groove portion 112g2 may be formed on the second insulating layer 112 between the second pad patterns 122vp, and a sixth groove portion 112g3 may be formed on the second insulating layer 112 between the second microcircuit portion 122ab and the second pad pattern 122vp. The shapes and dispositions of the first and second circuit patterns 121a and 121b are the same as described above, and the shapes and dispositions of the third and fourth circuit patterns 122a and 122b are also the same as described above.

Hereinafter, components of the printed circuit board 100B according to another exemplary embodiment will be additionally described with reference to accompanying drawings.

A material of the first and second insulating layers 111 and 112 may be an insulating material. The insulating material may be a thermosetting resin such as an epoxy resin, a thermoplastic resin such as polyimide, or an insulating material in which an inorganic filler such as silica and/or a reinforcing material such as a glass fiber is included in the resins, for example, CCL, PPG, ABF, or the like. However, the insulating material is not limited thereto, and may be a photosensitive insulating material such as a photoimageable dielectric (PID), other than such non-photosensitive insulating materials. As necessary, an inorganic material such as ceramic may be used as the material of the first and second insulating layers 111 and 112.

A material of the first and second circuit layers 121 and 122 may be a metal material. The metal material may be copper (Cu), aluminum (Al), silver (Ag), tin (Sn), gold (Au), nickel (Ni), lead (Pb), titanium (Ti), or alloys thereof. For example, the first and second circuit patterns 121a and 121b and the first pad pattern 121vp may include copper (Cu). In addition, the third and fourth circuit patterns 122a and 122b and the second circuit pattern 122vp may also include copper (Cu). The first and second microcircuit portions 121ab and 122ab of the first and second circuit layers 121 and 122, for example, the first and second circuit patterns 121a and 121b and the third and fourth circuit patterns 122a and 122b may each perform various functions depending on designs thereof. The first and second circuit patterns 121a and 121b and the third and fourth circuit patterns 122a and 122b may include, for example, a ground pattern, a power pattern, a signal pattern, or the like. Each of the patterns may have a linear shape. For example, each of the first and second circuit patterns 121a and 121b and third and fourth circuit patterns 122a and 122b may have a linear shape. In the drawing, one cross section may be illustrated to show line widths of the first and second circuit patterns 121a and 121b and third and fourth circuit patterns 122a and 122b having such a linear shape and intervals between lines, for example, lines and spaces. The first and second pad patterns 121vp and 122vp may also be pad patterns for various uses, such as a pad pattern for grounding, a pad pattern for power, and a pad pattern for signal.

A material of the first and second via patterns 131 and 132 may be a metal material. The metal material may be copper (Cu), aluminum (Al), silver (Ag), tin (Sn), gold (Au), nickel (Ni), lead (Pb), titanium (Ti), or alloys thereof. For example, the first and second via patterns 131 and 132 may include copper (Cu). The first and second via patterns 131 and 132 may each include a via for grounding, a via for power, a via for signal, or the like, depending on designs thereof. Each of the first and second via patterns 131 and 132 may have a shape filled with a metal material. Each of the first and second via patterns 131 and 132 may have a tapered shape.

Figure 7:
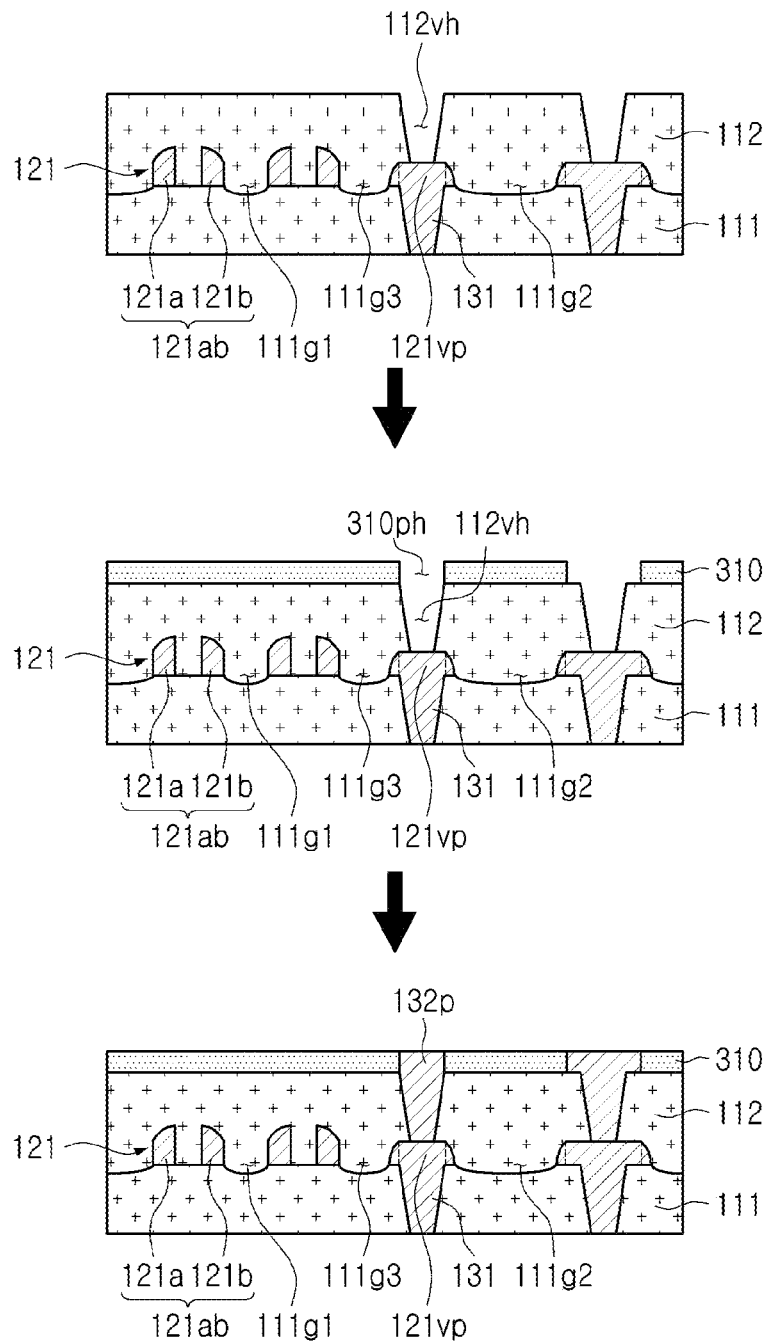
FIGS. 7 to 9 are schematic process views illustrating an example of a method of manufacturing the printed circuit board of FIG. 6.
Figure 8:
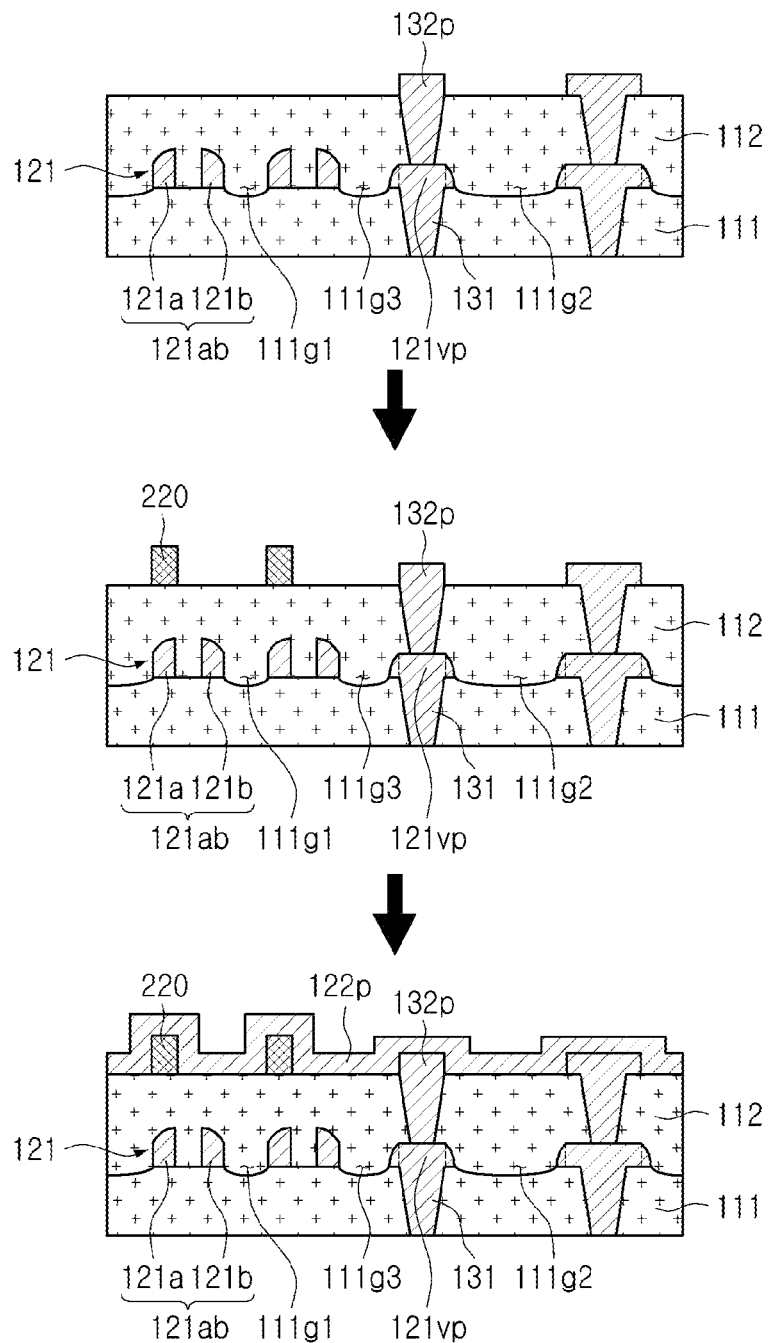
Figure 9:
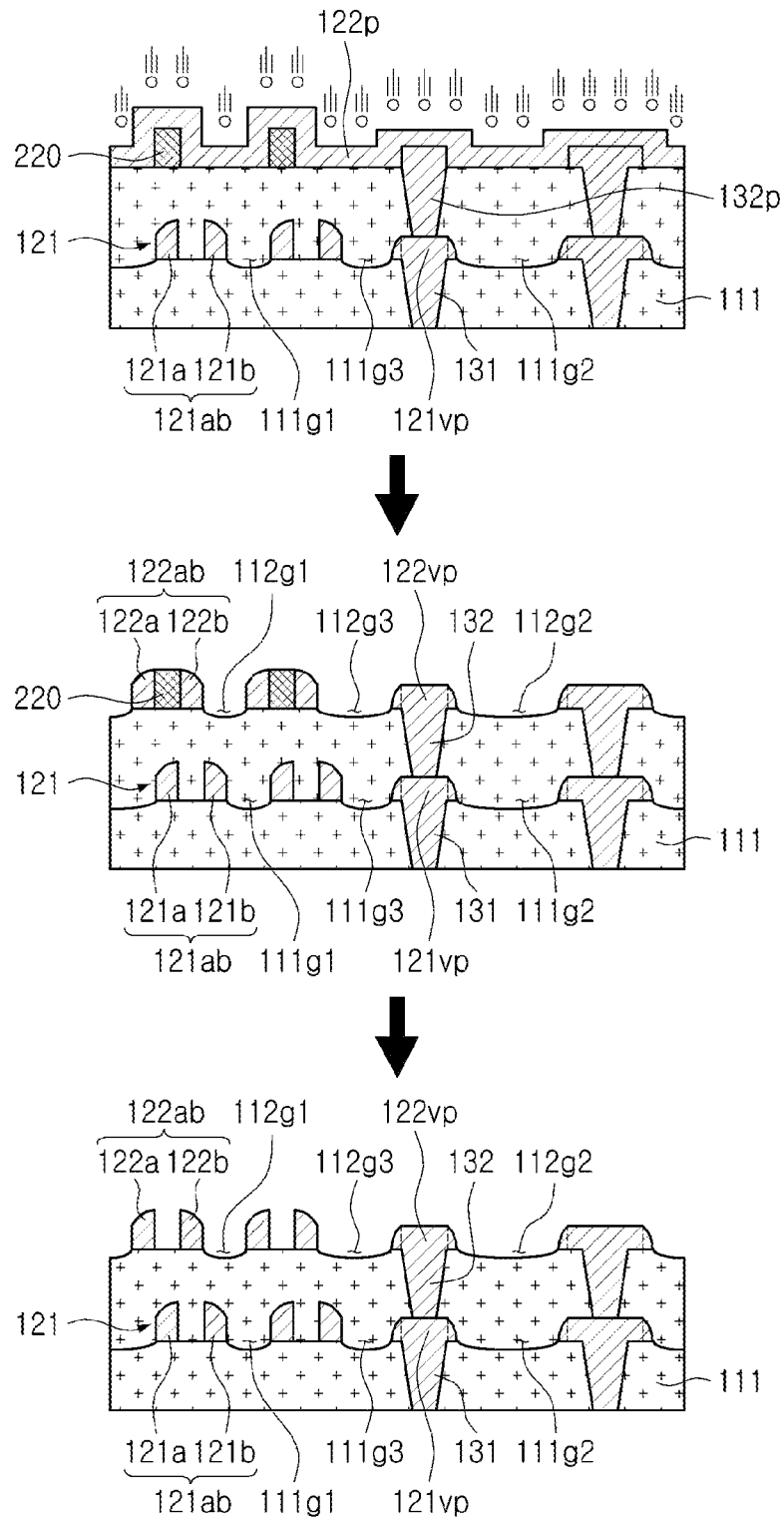

FIGS. 7 to 9 are schematic process views illustrating an example of a method of manufacturing the printed circuit board of FIG. 6.

Referring to FIG. 7, a first circuit layer 121 and a first via pattern 131 may be formed on a first insulating layer 111, and then a second insulating layer 112 on the first insulating layer 111. A method of forming the first circuit layer 121 and the first via pattern 131 is the same as a method of forming a second circuit layer 122 and a second via pattern 132, and thus, a detailed description thereof will be omitted. A via hole 112vh may be formed in the second insulating layer 112 to expose a first pad pattern 121vp. The via hole 112vh may be formed by mechanical drilling and/or laser drilling, or a photolithography process, depending on a material of the second insulating layer 112. A dry film 310 for via pad, having an opening exposing the via hole 112vh, may be formed on the second insulating layer 112. The dry film 310 for via pad may include a photosensitive material. The via hole 112vh of the second insulating layer 112 and the opening 310ph of the dry film 310 for via pad may be filled by electrolytic plating, or the like, to form a via plating layer 132p.

Referring to FIG. 8, the dry film 310 for a via pad may be peeled off. Patterned dry films 220 may be provided on the second insulating layer 112. The dry film 220 may include a photosensitive material. As described above, the dry film 220 may be patterned such that a line-to-space ratio is approximately one-to-many relationship, for example, one to three (1:3). A pattern plating layer 122p may be formed on the second insulating layer 112 to cover the patterned dry films 220. The pattern plating layer 122p may be formed using an isotropic plating process such as an electroless plating process, or the like.

Referring to FIG. 9, an anisotropic etching process may be performed. The anisotropic etching process may be performed using a dry etching process. When the anisotropic etching process is performed, a plurality of microcircuit portions 122ab, each including a pair of third and fourth circuit patterns 122a and 122b, may be formed. In addition, a plurality of second pad patterns 122vp may be formed. In addition, a second via pattern 132 may be formed. The second via pattern 122vp may include a portion of the via plating layer 132p and a portion of the pattern plating layer 122p. Fourth to sixth groove portions 112g1, 112g2, and 112g3 may be formed in a region, in which the dry film 220 is not present, of the second insulating layer 112 between the microcircuit portions 122ab, a region of the second insulating layer 112 between the second pad patterns 122vp, and a region between the microcircuit portion 122ab and the second pad pattern 122vp, respectively. When the dry film 220 is peeled off, a third circuit pattern 122a and a fourth circuit pattern 122b having a line-to-space ratio of approximately one to one (1:1) and a microcircuit portion 122ab including the third and fourth circuit patterns 122a and 122b may be obtained. The above-described printed circuit board 100B according to another exemplary embodiment will be manufactured through a series of processes.

Figure 10:
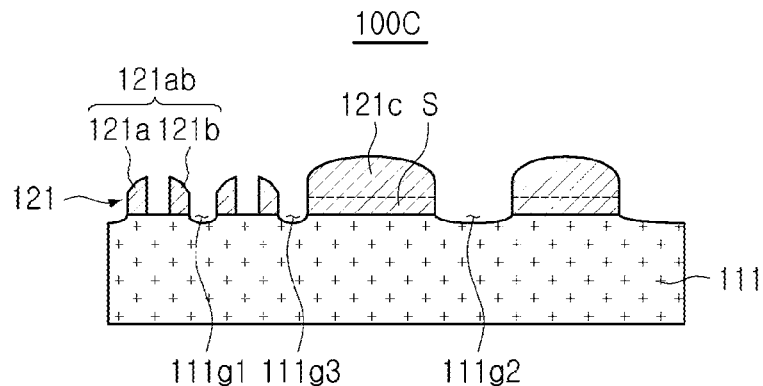
FIG. 10 is a schematic cross-sectional view illustrating another example of a printed circuit board.

FIG. 10 is a schematic cross-sectional view illustrating another example of a printed circuit board.

Referring to FIG. 10, as compared with the above-described printed circuit board 100A, a printed circuit board 100C according to another exemplary embodiment may include a first circuit layer 121 further including a third pad pattern 121c, in addition to first and second circuit patterns 121a and 121b. As described above, the first and second circuit patterns 121a and 121b may be disposed, as a pair of circuit patterns such that side surfaces thereof face each other, to constitute a microcircuit portion 121ab, and the third circuit pattern 121c may be disposed independently of the first and second circuit patterns 121a and 121b. The third circuit pattern 121c may be a circuit pattern formed using a plating process such as common SAP, MSAP, or the like, and may have a greater line width and a greater height than each of the first and second circuit patterns 121a and 121b.

As a feature of the process to be described later, the first and second circuit patterns 121a and 121b may include an isotropic plating layer such as an electroless plating layer and, thus, may be disposed without a seed layer. Meanwhile, the third circuit pattern 121c may include an electrolytic plating layer formed on the isotropic plating layer and, thus, may include a seed layer S. For example, the number of metal layers, constituting the third circuit pattern 121c, may be greater than the number of metal layers constituting each of the first and second circuit patterns 121a and 121b. The first and second circuit patterns 121a and 121b, as a pair of circuit patterns, may constitute a microcircuit pattern 121ab, and the circuit layer 121 may include plurality of microcircuit portions 121ab. In addition, the circuit layer 121 may include a plurality of third circuit patterns 121c. An interval between the first and second circuit patterns 121a and 121b of each of the plurality of microcircuit portions 121ab may be smaller than an interval between the plurality of third circuit patterns 121c. In addition, an interval between the plurality of microcircuit portions 121ab may be smaller than an interval between the plurality of third circuit patterns 121c. A first groove portion 111g1 may be formed on an insulating layer 111 between the microcircuit portions 121ab, a second groove portion 111g2 may be formed on the insulating layer 111 between the third circuit patterns 121c, and a third groove portion 111g3 may be formed on the insulating layer 111 between the microcircuit portion 121ab and the third circuit pattern 121c. The shapes and dispositions of the first and second circuit patterns 121a and 121b are the same as described above.

Hereinafter, components of the printed circuit board 100C according to another exemplary embodiment will be additionally described with reference to accompanying drawings.

A material of the circuit layer 121 may be a metal material. The metal material maybe copper (Cu), aluminum (Al), silver (Ag), tin (Sn), gold (Au), nickel (Ni), lead (Pb), titanium (Ti), or alloys thereof. For example, the first and second circuit patterns 121a and 121b and the third circuit pattern 121c may include copper (Cu). The first and second circuit patterns 121a and 121b and the third circuit pattern 121c of the circuit layer 121 may each perform various functions depending on designs thereof. The first and second circuit patterns 121a and 121b and the third circuit pattern 121c may include, for example, a ground pattern, a power pattern, a signal pattern, or the like. Each of the patterns may have a linear shape, a pad shape, or the like. For example, each of the first and second circuit patterns 121a and 121b and the third circuit pattern 121c may have a linear shape. In the drawing, one cross section may be illustrated to show line widths of the first and second circuit patterns 121a and 121b and the third circuit pattern 121c having such a linear shape and intervals between lines, for example, lines and spaces.

Figure 11:
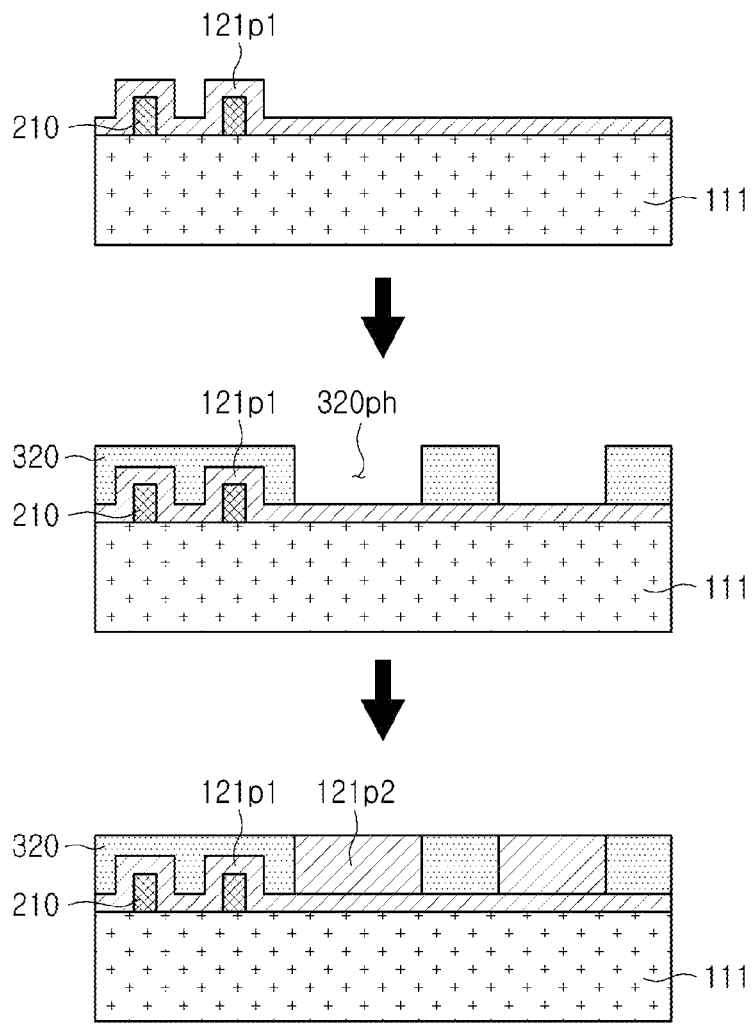
FIGS. 11 and 12 are schematic process views illustrating an example of a method of manufacturing the printed circuit board of FIG. 10.
Figure 12:
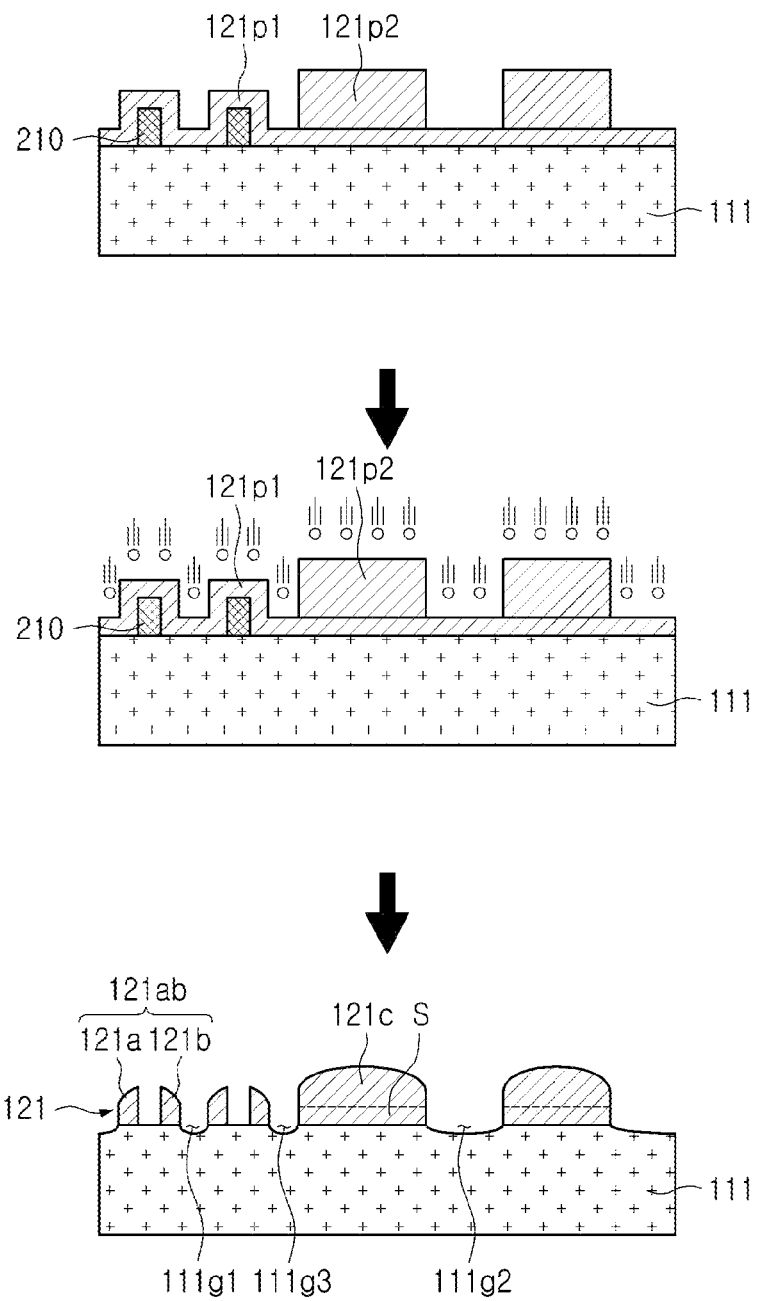

FIGS. 11 and 12 are schematic process views illustrating an example of a method of manufacturing the printed circuit board of FIG. 10.

Referring to FIG. 11, an insulating layer 111 may be prepared. Patterned first dry films 210 maybe provided on the first insulating layer 111, and then a first pattern plating layer 121p1 may be formed to cover the first dry films 210. Detailed descriptions of the above operations may be the same as described above. A second dry film 320 having an opening 320ph maybe provided on the first pattern plating layer 121p1. The opening 320ph of the second dry film 320 may be filled by electrolytic plating, or the like, to form a second pattern plating layer 121p2. In this case, the first pattern plating layer 121p1 may serve as a seed layer.

Referring to FIG. 12, the second dry film 320 may be peeled off. An anisotropic etching process may be performed. The anisotropic etching process may be performed using a dry etching process. When the anisotropic etching process is performed, a plurality of microcircuit portions 121ab, each including a pair of first and second circuit patterns 121a and 121b, maybe formed. In addition, a plurality of third circuit patterns 121c, each including a seed layer S, may be formed. In this case, first to third groove portions 111g1, 111g2, and 111g3 may be formed in a region, in which the first dry film 210 is not present, of the insulating layer 111 between the microcircuit portions 121ab, a region of the insulating layer 111 between the third circuit patterns 121c, and a region of the insulating layer 111 between the microcircuit portion 121ab and the third circuit pattern 121c. When the dry film 210 is peeled off, a first circuit pattern 121a and a second circuit pattern 121b, having a line-to-space ratio of approximately one to one (1:1), and a microcircuit portion 121ab including the first and second circuit patterns 121a and 121b may be obtained. The above-described printed circuit board 100C may be manufactured through a series of processes.

Figure 13:
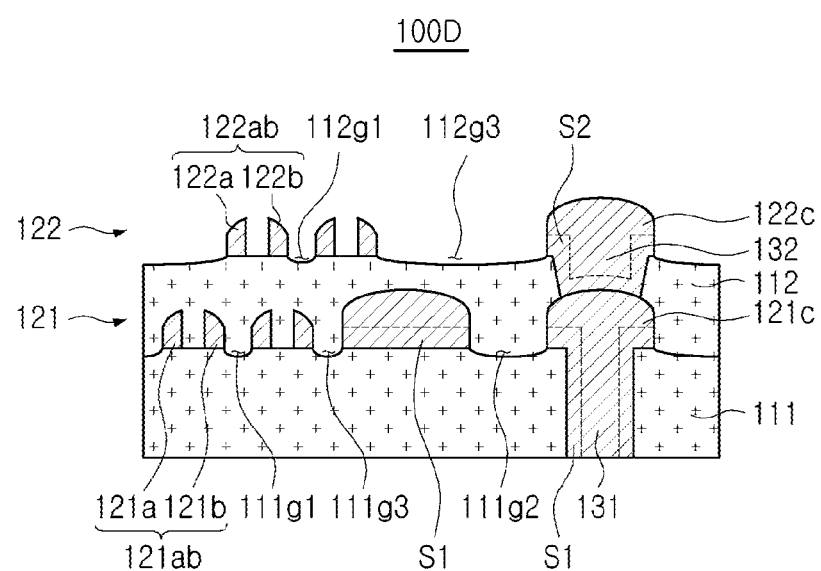
FIG. 13 is a schematic cross-sectional view illustrating another example of a printed circuit board.

FIG. 13 is a schematic cross-sectional view illustrating another example of a printed circuit board.

Referring to FIG. 13, as compared with the above-described printed circuit board 100c, a printed circuit board 100D according to another exemplary embodiment may include circuit layers 121 and 122 having a multilayer structure, and via patterns 131 and 132 may be formed on insulating layers 111 and 112 to achieve electrical connection between the circuit layer 121 and 122 having a multi-layer structure. For example, the printed circuit board 100D may include a first insulating layer 111, a first circuit layer 121 disposed on the first insulating layer 111, a first via pattern 131 penetrating through the first insulating layer 111, a second insulating layer 112 disposed on the first insulating layer 111 and covering the first circuit layer 121, a second circuit layer 122 disposed on the second insulating layer 112, and a second via pattern 132 penetrating through the second insulating layer 112. In this case, the first circuit layer 121 may include first and second circuit patterns 121a and 121b and a third circuit pattern 121c, and the second circuit layer 122 nay include fourth and fifth circuit patterns 122a and 122b and a sixth circuit pattern 122c. The first via pattern 131 may be connected to the third circuit pattern 121c, and the second via pattern 132 may be connected to the third and sixth circuit patterns 121c and 122c.

As a feature of the process to be described later, at least one of the third circuit patterns 121c may be integrated with the first via pattern 131 and may include a first seed layer S1. Similarly, at least one of the sixth circuit patterns 122c maybe integrated with the second via pattern 132 and may include a second seed layer S2. The first and second circuit patterns 121*a* and 121*b*, as a pair of circuit patterns having a substantially symmetric shape, may constitute a first microcircuit portion 121*ab*. A first groove portion 111*g*1 may be formed between the first microcircuit portions 121*a*. In addition, a second groove portion 111*g*2 may be formed on the first insulating layer 111 between the third circuit patterns 121*c*, and a third groove portion 111*g*3 on the first insulating layer 111 between the first microcircuit portion 121*ab* and the third circuit pattern 121*c*. Similarly, the fourth and fifth circuit patterns 122*a* and 122*b*, as a pair of circuit patterns having a substantially symmetric shape, may constitute a second microcircuit portion 122*ab*. A fourth groove portion 112*g*1 may be formed on the second insulating layer 112 between the second microcircuit portions 122*ab*. In addition, a fifth groove portion 112*g*2 may be formed on the second insulating layer 112 between the sixth circuit patterns 122*c*, and a sixth groove portion 112*g*3 may be formed on the second insulating layer 112 between the second microcircuit portion 122*ab* and the sixth circuit pattern 122*c*. The shapes and dispositions of the first to third circuit patterns 121*a*, 121*b*, and 121*c* may be the same as described above, and the shapes and dispositions of the fourth to sixth circuit patterns 122*a*, 122*b*, and 122*c* may also be the same as described above.

Hereinafter, components of the printed circuit board 100D according to another exemplary embodiment will be additionally described with reference to accompanying drawings.

A material of the first and second insulating layers 111 and 112 may be an insulating material. The insulating material may be a thermosetting resin such as an epoxy resin, a thermoplastic resin such as polyimide, or an insulating material in which an inorganic filler such as silica and/or a reinforcing material such as a glass fiber is included in the resins, for example, CCL, PPG, ABF, or the like. However, the insulating material is not limited thereto, and may be a photosensitive insulating material such as a PID, other than such non-photosensitive insulating materials. As necessary, an inorganic material such as ceramic may be used as the material of the insulating layers 111 and 112.

A material of the first and second circuit layer 121 and 122 may be a metal material. The metal material may be copper (Cu), aluminum (Al), silver (Ag), tin (Sn), gold (Au), nickel (Ni), lead (Pb), titanium (Ti), or alloys thereof. For example, the first and second circuit patterns 121*a* and 121*b* and the third circuit pattern 121*c* may include copper (Cu). In addition, the fourth and fifth circuit patterns 122*a* and 122*b* and the sixth circuit pattern 122*c* may also include copper (Cu). The first and second circuit patterns 121*a* and 121*b* and the third circuit pattern 121*c* and the fourth and fifth circuit patterns 122*a* and 122*b* and the sixth circuit pattern 122*c* may each perform various functions depending on designs thereof. Each of the first and second circuit patterns 121*a* and 121*b* and the third circuit pattern 121*c* and the fourth and fifth circuit patterns 122*a* and 122*b* and the sixth circuit pattern 122*c* may include, for example, a ground pattern, a power pattern, a signal pattern, or the like. Each of the patterns may have a linear shape, a pad shape, or the like. For example, each of the first and second circuit patterns 121*a* and 121*b* and the third circuit pattern 121*c* and the fourth and fifth circuit patterns 122*a* and 122*b* and the sixth circuit pattern 122*c* may have a linear shape. In the drawings, one cross section may be illustrated to show line widths of the first and second circuit patterns 121*a* and 121*b* and the third circuit pattern 121*c* and the fourth and fifth circuit patterns 122*a* and 122*b* and the sixth circuit pattern 122*c* having such a linear shape and intervals between lines, for example, lines and spaces.

A material of the first and second via patterns 131 and 132 may be a metal material. The metal material may be copper (Cu), aluminum (Al), silver (Ag), tin (Sn), gold (Au), nickel (Ni), lead (Pb), titanium (Ti), or alloys thereof. For example, the first and second via patterns 131 and 132 may include copper (Cu). The first and second via patterns 131 and 132 may each include a via for grounding, a via for power, a via for signals, or the like, depending on designs thereof. Each of the first and second via patterns 131 and 132 may have a shape filled with a metal material. Each of the first and second via patterns 131 and 132 may have a tapered shape.

FIGS. 14 to 17 are schematic process views illustrating an example of a method of manufacturing the printed circuit board of FIG. 13.

Figure 14:
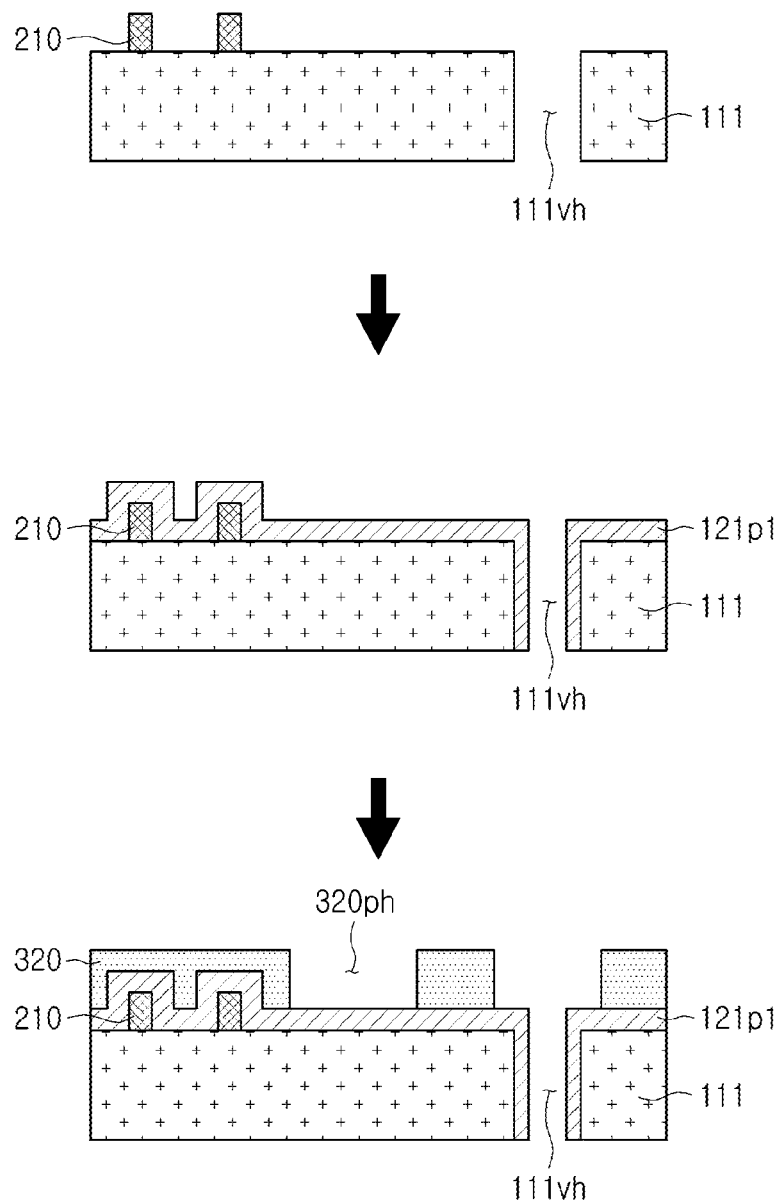
FIGS. 14 to 17 are schematic process views illustrating an example of a method of manufacturing the printed circuit board of FIG. 13.

Referring to FIG. 14, patterned first dry films 210 may be provided on a first insulating layer 111. The description of the first dry films 210 is the same as described above. A first via hole 111*vh* may be formed in the first insulating layer 111. The first via hole 111*vh* may be formed by mechanical drilling and/or laser drilling, or a photolithography process, depending on a material of the first insulating layer 111. A first pattern plating layer 121*p* may be formed on the first insulating layer 111 to cover the first dry film 210. The first pattern plating layer 121*p* may also be disposed on a sidewall of the first via hole 111*vh*. The first pattern plating layer 121*p* may be formed by an isotropic plating process such as an electroless plating process, or the like. A second dry film 320 having an opening 320*ph* may be provided on the first pattern plating layer 121*p*1. The second dry film 320 may also include a photosensitive material.

Figure 15:
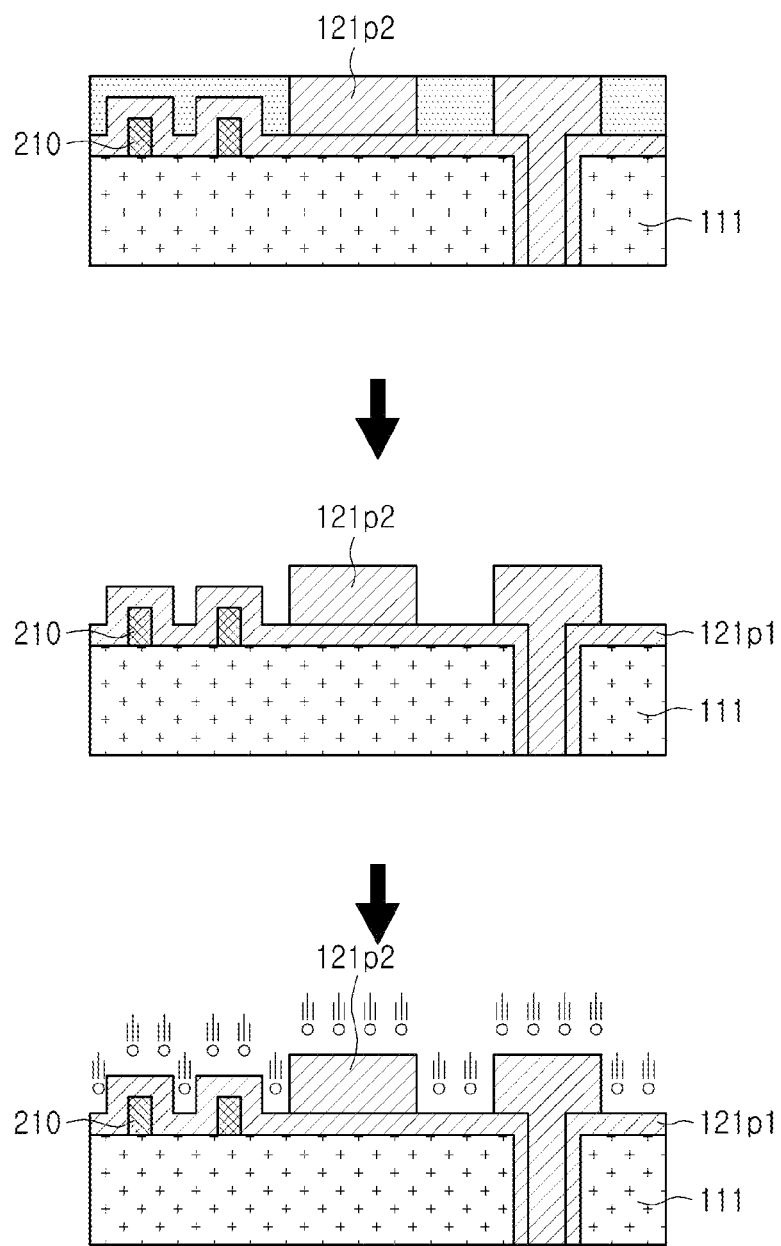

Referring to FIG. 15, the opening 320*ph* of the second dry film 320 may be filled by electrolytic plating, or the like, to form a second pattern plating layer 121*p*2. The second dry film 320 maybe peeled off. An anisotropic etching process may be performed. The anisotropic etching process may be performed using a dry etching process.

Figure 16:
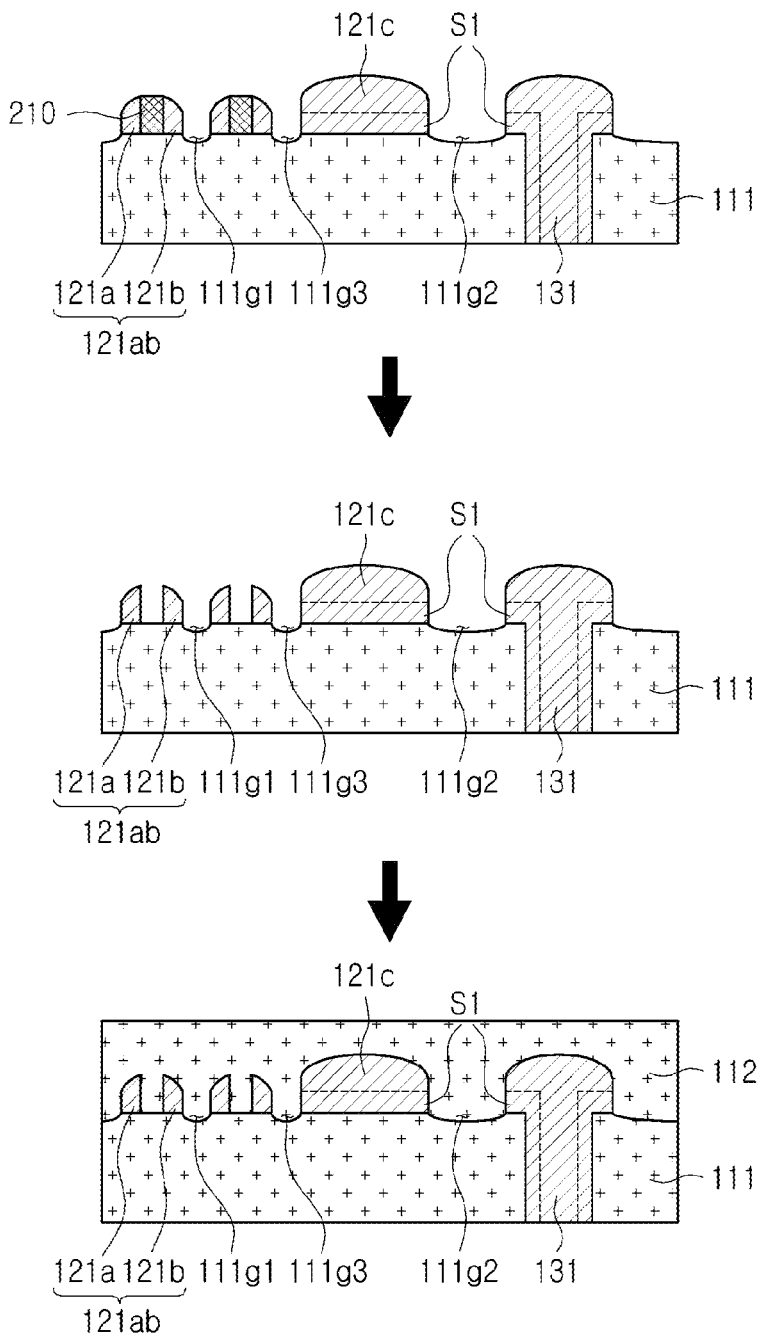

Referring to FIG. 16, when the anisotropic etching process is performed, a plurality of microcircuit portions 121*ab*, each including a pair of first and second circuit patterns 121*a* and 121*b*, may be formed. In addition, a plurality of third circuit patterns 121*c*, each including a seed layer S1, may be formed. In addition, a first via pattern 131 may be formed to be connected to the third circuit pattern 121*c*. In this case, first to third groove portions 111*g*1, 111*g*2, and 111*g*3 may be formed in a region, in which the first dry film 210 is not present, of the first insulating layer 111 between the microcircuit portions 121*ab*, a region of the insulating layer 111 between the third circuit patterns 121*c*, and a region of the first insulating layer 111 between the microcircuit portion 121*ab* and the third circuit pattern 121*c*, respectively. When the first dry film 210 is peeled off, first and second circuit patterns 121*a* and 121*b* having a line-to-space ratio of approximately one to one (1:1) and a microcircuit portion 121*ab* including the first and second circuit patterns 121*a* and 121*b* may be obtained. A second insulating layer 112 may be formed on the first insulating layer 111.

Figure 17:
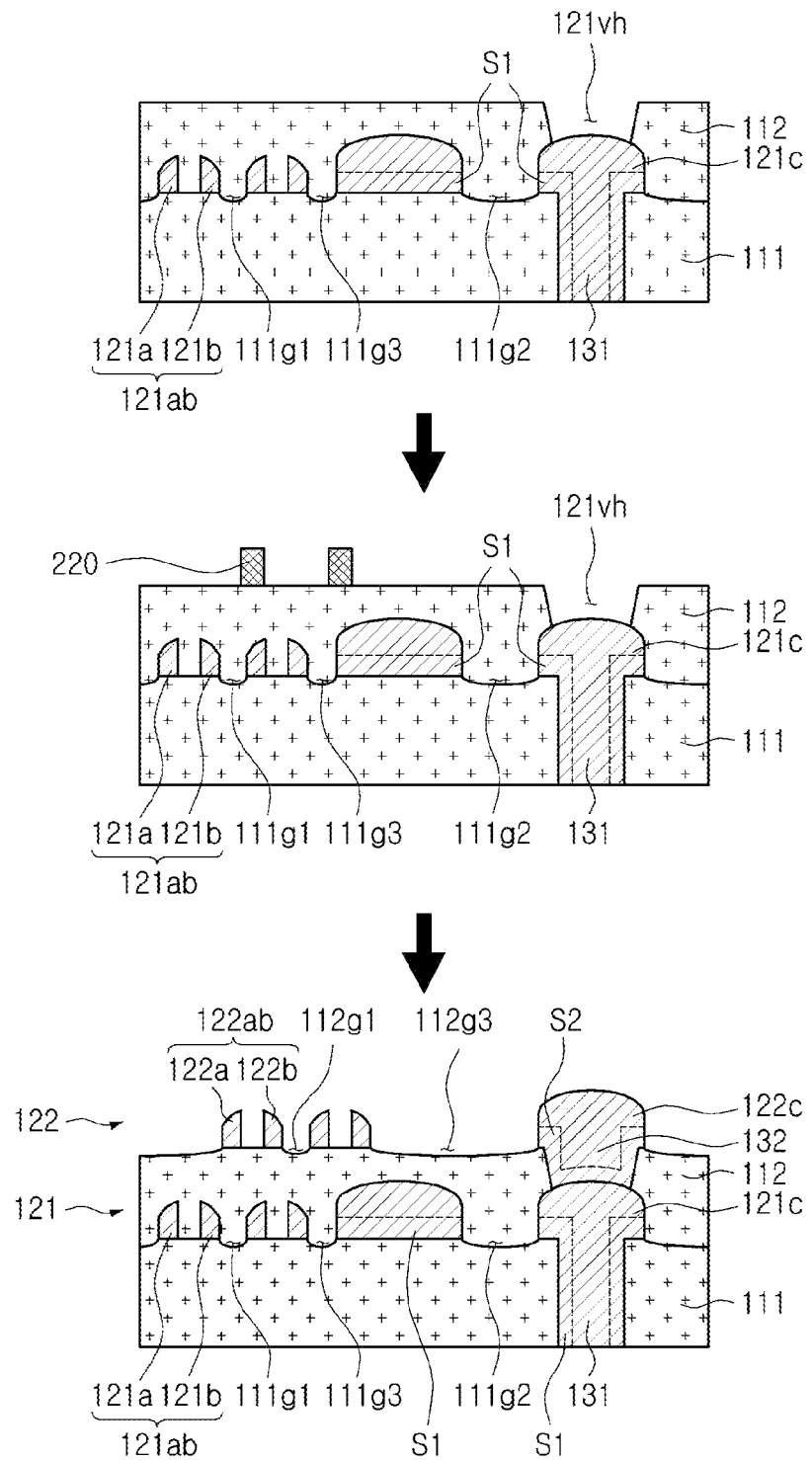

Referring to FIG. 17, a second via hole 112*vh* may be formed on the second insulating layer 112. The second via hole 112*vh* may be formed by mechanical drilling and/or laser drilling, or a photolithography process, depending on a material of the second insulating layer 112. Patterned third dry films 220 may be provided on the second insulating layer 112. The description of the third dry film 220 may be the same as the description of the first dry film 210. The processes described with reference to FIGS. 14 to 16 may be repeatedly performed. The above-described printed circuit board 100D may be manufactured through a series of processes.

Figure 18:
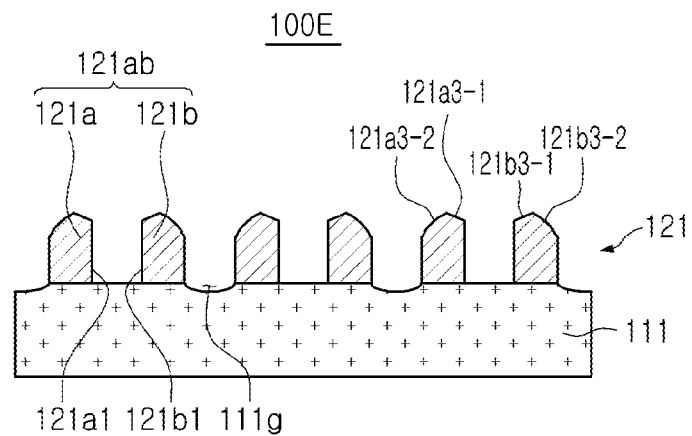
FIG. 18 is a schematic cross-sectional view illustrating another example of a printed circuit board.

FIG. 18 is a schematic cross-sectional view illustrating another example of a printed circuit board.

As compared with the above-described printed circuit board 100A, a printed circuit board 100E according to another exemplary embodiment may include a first circuit pattern 121a and a second circuit pattern 121b, each having a top surface having an inflection point. Such inflection points may be formed by performing a partial etching process on the top surfaces of the first and second circuit patterns 121a and 121b. For example, the top surface of the first circuit pattern 121a may have a first top surface 121a3-1, in which a height is gradually increased form the end of the above-described first side surface to the inflection point, and a second top surface 121a3-2 in which a height is gradually decreased from the inflection point to the end of the above-described second side surface. In addition, the top surface of the second circuit pattern 121b may have a first top surface 121b3-1, in which a height is gradually increased from the end of the above-described first side surface to the inflection point, and a second top surface 121b3-2 in which a height is decreased from the inflection point to the end of the above-described second side surface. The other details are the same as described above.

Figure 19:
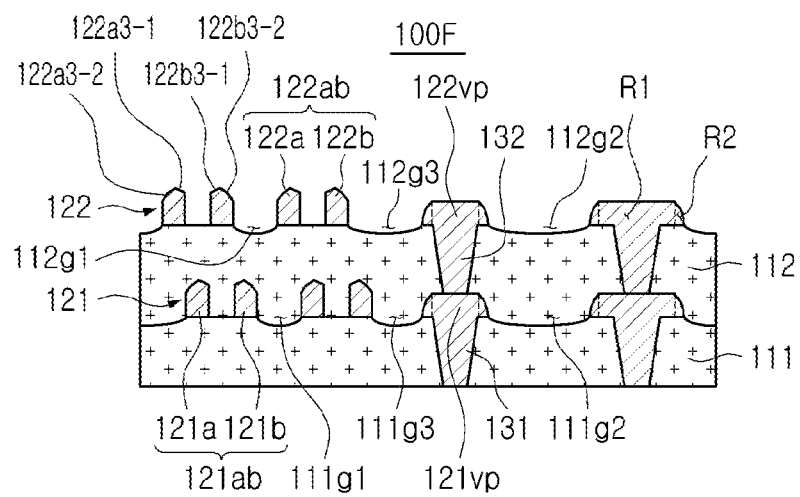
FIG. 19 is a schematic cross-sectional view illustrating another example of a printed circuit board.

FIG. 19 is a schematic cross-sectional view illustrating another example of a printed circuit board.

As compared with the above-described printed circuit board 100B, a printed circuit board 100F according to another exemplary embodiment may include first and second circuit patterns 121a and 121b, each having a top surface having an inflection point, and third and fourth circuit patterns 122a and 122b, each having a top surface having an inflection point. Such inflection points may be formed by performing a partial etching process on the top surfaces of the first and second circuit patterns 121a and 121b and the top surfaces of the third and fourth circuit patterns 122a and 122b. For example, the top surface of the first circuit pattern 121a may have a first top surface 121a3-1, in which a height is gradually increased from the end of the above-described first side surface to the inflection point, and a second top surface 121a3-2 in which a height is gradually decreased from the inflection point to the end of the above-described second side surface. In addition, the top surface of the second circuit pattern 121b may have a first top surface 121b3-1, in which a height is gradually increased from the end of the above-described first side surface to the inflection point, and a second top surface 121b3-2 in which a height is decreased from the inflection point to the end of the above-described second side surface. The other details are the same as described above. Similarly, the top surface of the third circuit pattern 122a may have a first top surface 122a3-1, in which a height is gradually increased from the end of the above-described first side surface to the inflection point, and a second top surface 122a3-2 in which a height is gradually decreased from the inflection point to the end of the above-described second side surface. In addition, the fourth circuit pattern 122b may have a first top surface 122b3-1, in which a height is gradually increased from the end of the above-described first side surface to the inflection point, and a second top surface 122b3-2 in which a height is gradually decreased from the inflection point to the end of the above-described second side surface. The other details are the same as described above.

Figure 20:
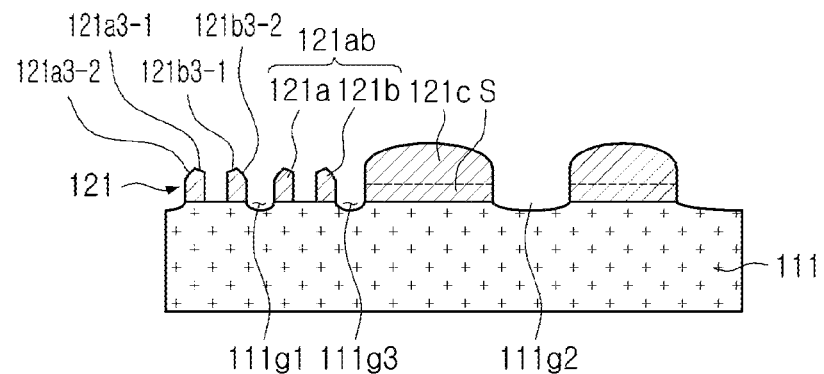
FIG. 20 is a schematic cross-sectional view illustrating another example of a printed circuit board.

FIG. 20 is a schematic cross-sectional view illustrating another example of a printed circuit board.

As compared with the above-described printed circuit board 100C, a printed circuit board 100G according to another exemplary embodiment may include a fist circuit pattern 121a and a second circuit pattern 121b, each having a top surface having an inflection point. Such inflection points may be formed by performing a partial etching process on the top surfaces of the first and second circuit patterns 121a and 121b. For example, the top surface of the first circuit pattern 121a may have a first top surface 121a3-1, in which a height is gradually increased from the end of the above-described first side surface to the inflection point, and a second top surface 121a3-2 in which a height is gradually decreased from the inflection point to the end of the above-described second side surface. In addition, the top surface of the second circuit pattern 121b may have a first top surface 121b3-1, in which a height is gradually increased from the end of the above-described first side surface to the inflection point, and a second top surface 121b3-2 in which a height is gradually decreased from the inflection point to the end of the above-described second side surface. The other details are the same as described above.

Figure 21:
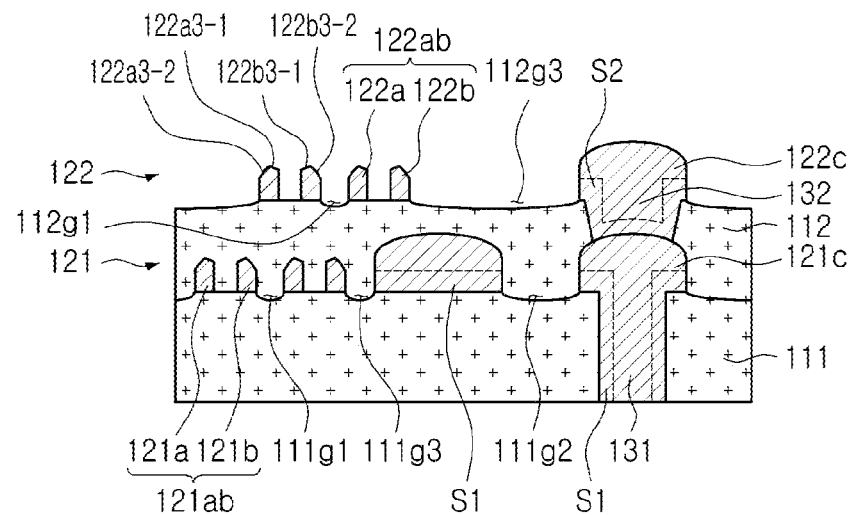
FIG. 21 is a schematic cross-sectional view illustrating another example of a printed circuit board.

FIG. 21 is a schematic cross-sectional view illustrating another example of a printed circuit board.

As compared with the above-described printed circuit board 100D, a printed circuit board 100H according to another exemplary embodiment may include a first circuit pattern 121a and a second circuit pattern 121b, each having a top surface having an inflection point, and a fourth circuit pattern 122a and a fifth circuit pattern 122b, each having a top surface having an inflection point. Such inflection points may be formed by performing a partial etching process on the top surfaces of the first and second circuit patterns 121a and 121b and the top surface of the fourth and fifth circuit patterns 122a and 122b. For example, the top surface of the first circuit pattern 121a may have a first top surface 121a3-1, in which a height is gradually increased from the end of the above-described first side surface to the inflection point, and a second top surface 121a3-2 in which a height is gradually decreased from the inflection point to the end of the above-described second side surface. In addition, the top surface of the second circuit pattern 121b may have a first top surface 121b3-1, in which a height is gradually increased from the end of the above-described first side surface to the inflection point, and a second top surface 121b3-2 in which a height is gradually decreased from the inflection point to the end of the above-described second side surface. The other details are the same as described above. Similarly, the top surface of the fourth circuit pattern 122a may have a first top surface 122a3-1, in which a height is gradually increased from the end of the above-described first side surface to the inflection point, and a second top surface 122a3-2 in which a height is gradually decreased from the inflection point to the end of the above-described second side surface. In addition, the top surface of the fifth circuit pattern 122b may have a first top surface 122b3-1, in which a height is gradually increased from the end of the above-described first side surface to the inflection point, and a second top surface 122b3-2 in which a height is gradually decreased from the inflection point to the end of the above-described second side surface. The other details are the same as described above.

Figure 22:
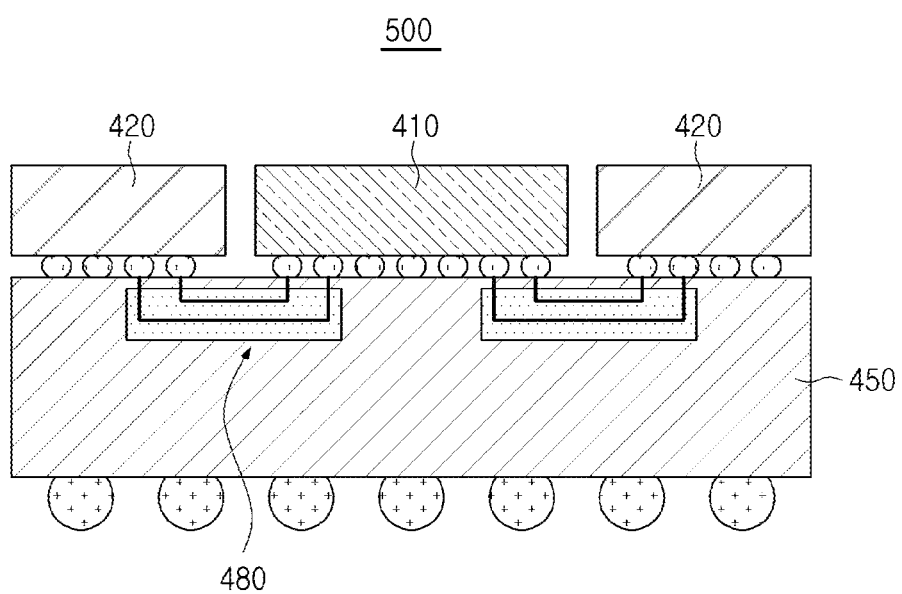
FIG. 22 is a schematic cross-sectional view illustrating another example of an electronic component package.

FIG. 22 is a schematic cross-sectional view illustrating another example of an electronic component package.

Referring to FIG. 22, an electronic component package 500 according to an exemplary embodiment may include a package substrate 450, a connection structure 480 disposed in the package substrate 450, and a plurality of electronic components 410 and 420 disposed on the package substrate 450 and electrically connected to each other through the connection structure 480. The package substrate 450 may be a ball grid array (BGA) substrate. The connection structure 480 may be a substrate provided with a microcircuit. At least one of the above-described printed circuit boards 100A to 100H may be applied as such a board. Each of the plurality of electronic components 410 and 420 may be a logic chip or a memory chip. As described above, the above-described printed circuit board may be applied to a substrate requiring a microcircuit.

As described above, exemplary embodiments provide a printed circuit board, capable of securing a margin of an exposure process. In addition, exemplary embodiments provide a printed circuit board, capable of improving circuit integration density.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While exemplary embodiments have been shown and described above, it will be apparent to those skilled in the art that modifications and variations could be made without departing from the scope of the present disclosure as defined by the appended claims.

What is claimed is:

1. A printed circuit board comprising:
a first insulating layer; and
a first metal layer being in contact with the first insulating layer,
wherein the first metal layer comprises a first circuit pattern, a second circuit pattern, and a third circuit pattern disposed outside of the first and second circuit patterns,
each of the first and second circuit patterns includes a first side surface, a second side surface opposing the first side surface, and a top surface connected to ends of the first and second side surfaces, when viewed in a cross section direction,
the first side surface of the first circuit pattern and the first side surface of the second circuit pattern are disposed to face each other,
a height of the first side surface of the first circuit pattern is greater than a height of the second side surface of the first circuit pattern, and a height of the first side surface of the second circuit pattern is greater than a height of the second side surface of the second circuit pattern,
the first insulating layer extends between the first circuit pattern and the second circuit pattern, and
a height of the third circuit pattern is greater than a height of the each of the first and second circuit patterns.

2. The printed circuit board of claim 1, wherein the first and second circuit patterns, as a pair of circuit patterns, constitute a microcircuit portion, and
the first metal layer comprises a plurality of microcircuit portions.

3. The printed circuit board of claim 2, wherein the first insulating layer includes a groove portion between the plurality of microcircuit portions.

4. The printed circuit board of claim 3, wherein the groove portion is recessed toward a lower surface of the first insulating layer, from an upper surface of the first insulating layer between the first and second circuit patterns.

5. The printed circuit board of claim 1, wherein a top surface of the first circuit pattern includes a rounded shape of which a height is decreased from the end of the first side surface of the first circuit pattern to the end of the second side surface of the first circuit pattern, and
a top surface of the second circuit pattern includes a rounded shape of which a height is decreased from the end of the first side surface of the second circuit pattern to the end of the second side surface of the second circuit pattern.

6. The printed circuit board of claim 1, wherein a top surface of each of the first and second circuit patterns includes an inflection point,
the top surface of the first circuit pattern comprises a first top surface, in which a height is increased from the end of the first side surface of the first circuit pattern to the inflection point of the top surface of the first circuit pattern, and a second top surface in which a height is decreased from the inflection point of the top surface of the first circuit pattern to the end of the second side surface of the first circuit pattern, and
the top surface of the second circuit pattern comprises a first top surface, in which a height is increased from the end of the first side surface of the second circuit pattern to the inflection point of the top surface of the second circuit pattern, and a second top surface in which a height is decreased from the inflection point of the top surface of the second circuit pattern to the end of the second side surface of the second circuit pattern.

7. The printed circuit board of claim 1, further comprising:
- a second insulating layer disposed on the first insulating layer and covering the first metal layer; and
- a second metal layer disposed on the second insulating layer,
- wherein the second metal layer comprises a fourth circuit pattern and a fifth circuit pattern,
- each of the fourth and fifth circuit patterns includes a first side surface, a second side surface opposing the first side surface, and a top surface connected to ends of the first and second side surfaces, when viewed in the cross section direction,
- the first side surface of the fourth circuit pattern and the first side surface of the fifth circuit pattern are disposed to face each other,
- a height of the first side surface of the fourth circuit pattern is greater than a height of the second side surface of the fourth circuit pattern, and
- a height of the first side surface of the fifth circuit pattern is greater than a height of the second side surface of the fifth circuit pattern.

8. The printed circuit board of claim 7, further comprising:
- a via pattern penetrating through the second insulating layer,
- wherein the first and second metal layers further comprise a first pad pattern and a second pad pattern, respectively,
- the first and second pad patterns are connected to each other through the via pattern, and
- the second pad pattern comprises a first region integrated with the via pattern without a boundary and a second region surrounding the first region and having a boundary with the first region.

9. A printed circuit board comprising:
- a first insulating layer; and
- a first metal layer being in contact with the first insulating layer,
- wherein the first metal layer comprises a first circuit pattern and a second circuit pattern such that side surfaces of the first and second circuit patterns face each other, and a third circuit pattern disposed outside of the first and second circuit patterns,
- a line width of the third circuit pattern is greater than a line width of each of the first and second circuit patterns,
- the first insulating layer extends between the first circuit pattern and the second circuit pattern,
- a height of the third circuit pattern is greater than a height of the each of the first and second circuit patterns,
- each of the first circuit pattern, the second circuit pattern, and the third circuit pattern of the first metal layer protrudes from the first insulating layer and is in contact with the first insulating layer,
- among the first to third circuit patterns, only the third circuit pattern comprises a seed layer, and
- the first circuit pattern, the second circuit pattern, and the seed layer of the third circuit pattern are in contact with the first insulating layer.

10. The printed circuit board of claim 9, wherein the first and second circuit patterns constitute a microcircuit portion as a pair of circuit patterns,
- the first metal layer comprises a plurality of microcircuit portions, and
- the first metal layer comprise a plurality of third circuit patterns.

11. The printed circuit board of claim 10, wherein an interval between the first and second circuit patterns of each of the plurality of microcircuit portions is smaller than an interval between the plurality of third circuit patterns, and an interval between the plurality of microcircuit portions is smaller than the interval between the plurality of third circuit patterns.

12. The printed circuit board of claim 9, further comprising:
- a second insulating layer disposed on the first insulating layer and covering the first metal layer; and
- a second metal layer disposed on the second insulating layer,
- wherein the second metal layer comprises a fourth circuit pattern and a fifth circuit pattern, disposed as a pair of circuit patterns, such that side surfaces of the fourth and fifth circuit patterns face each other, and a sixth circuit pattern disposed outside of the fourth and fifth circuit patterns, and
- a line width of the sixth circuit pattern is greater than each line width of the fourth and fifth circuit patterns.

13. The printed circuit board of claim 12, further comprising:
- a via pattern penetrating through the second insulating layer,
- wherein the third and sixth circuit patterns are connected to each other through the via pattern, and
- the sixth circuit pattern is integrated with the via pattern without a boundary.

14. The printed circuit board of claim 9, wherein the first insulating layer includes a groove portion between the second circuit pattern and the third circuit pattern.

15. The printed circuit board of claim 14, wherein among a region of the first insulating layer between the first circuit pattern and the second circuit pattern and a region of the first insulating layer between the second circuit pattern and the third circuit pattern, the groove portion is disposed only in the region between the second circuit pattern and the third circuit pattern.

16. A printed circuit board comprising:
- a first insulating layer;
- a first metal layer being in contact with the first insulating layer and comprising a first circuit pattern, a second circuit pattern, and a first pad pattern disposed outside of the first and second circuit patterns;
- a second insulating layer disposed on the first insulating layer and covering the first metal layer;
- a second metal layer disposed on the second insulating layer and comprising a second pad pattern; and
- a via disposed in the second insulating layer and connecting the first pad pattern and the second pad pattern to each other,
- wherein each of the first and second circuit patterns includes a first side surface, a second side surface opposing the first side surface, and a top surface connected to ends of the first and second side surfaces, when viewed in a cross section direction,
- the first side surface of the first circuit pattern and the first side surface of the second circuit pattern are disposed to face each other,
- a height of the first side surface of the first circuit pattern is greater than a height of the second side surface of the first circuit pattern, and a height of the first side surface of the second circuit pattern is greater than a height of the second side surface of the second circuit pattern,
- a height of each of the first and second circuit patterns is different from a height of the first pad pattern, and the first insulating layer extends between the first circuit pattern and the first pad pattern.

17. The printed circuit board of claim 16, wherein the height of each of the first and second circuit patterns is less than the height of the first pad pattern.

18. The printed circuit board of claim 16, wherein the height of the first and second circuit patterns is greater than the height of the first pad pattern.

19. The printed circuit board of claim 16, wherein a portion of the first insulating layer between the first circuit pattern and the first pad pattern has at least one groove portion.

20. The printed circuit board of claim 16, wherein among two portions of the first insulating layer respectively extending from opposing side surfaces of the first circuit pattern, only one of the two portions of the first insulating layer has a groove portion recessed from a portion of the first insulating layer on which the first circuit pattern is disposed.

21. The printed circuit board of claim 16, wherein among two portions of the first insulating layer respectively extending from opposing side surfaces of the first pad pattern, each of the two portions of the first insulating layer has a groove portion recessed from a portion of the first insulating layer on which the first pad pattern is disposed.

* * * * *